US012761687B2

(12) United States Patent
Alcorn

(10) Patent No.: US 12,761,687 B2
(45) **Date of Patent: *Oct. 13, 2026**

(54) OPTIMAL TIMER ARRAY

(71) Applicant: pSemi Corporation, San Diego, CA (US)

(72) Inventor: Gerald Alcorn, San Diego, CA (US)

(73) Assignee: pSemi Corporation, San Diego, CA (US)

(*) Notice: Subject to any disclaimer, the term of this patent is extended or adjusted under 35 U.S.C. 154(b) by 15 days.

This patent is subject to a terminal disclaimer.

(21) Appl. No.: 18/904,770

(22) Filed: Oct. 2, 2024

(65) Prior Publication Data

US 2025/0028352 A1 Jan. 23, 2025

Related U.S. Application Data

(63) Continuation of application No. 18/452,193, filed on Aug. 18, 2023, now Pat. No. 12,135,576, which is a continuation of application No. 17/182,148, filed on Feb. 22, 2021, now Pat. No. 11,768,515.

(51) Int. Cl.
*G06F 1/08* (2006.01)
*G05B 19/045* (2006.01)
*H03K 19/17704* (2020.01)

(52) U.S. Cl.
CPC ............. *G06F 1/08* (2013.01); *G05B 19/045* (2013.01); *H03K 19/17716* (2013.01)

(58) Field of Classification Search
CPC .... G06F 1/08; G05B 19/045; H03K 19/17716
See application file for complete search history.

(56) References Cited

U.S. PATENT DOCUMENTS

| | | | | |
|---|---|---|---|---|
| 11,768,515 | B2 | 9/2023 | Alcorn | |
| 12,135,576 | B2 | 11/2024 | Alcorn | |
| 2019/0020433 | A1 | 1/2019 | Pitigoi-Aron | |
| 2019/0347239 | A1* | 11/2019 | Mishra | G06F 13/4291 |
| 2020/0356134 | A1* | 11/2020 | Nandlinger | G06F 1/14 |
| 2021/0181788 | A1* | 6/2021 | Mishra | H04L 12/40019 |
| 2022/0222200 | A1* | 7/2022 | Mishra | G06F 13/4291 |
| 2022/0269303 | A1 | 8/2022 | Alcorn | |
| 2024/0019892 | A1 | 1/2024 | Alcorn | |

* cited by examiner

*Primary Examiner* — Seokjin Kim
(74) *Attorney, Agent, or Firm* — Steinfl + Bruno LLP

(57) ABSTRACT

Methods and apparatuses for an optimal timer array using a single reference counter are presented. According to one aspect, timers of the timer array use the single reference counter to process different timed trigger requests. A count translation logic block translates counts corresponding to the requested timed triggers to target values of the reference counter. Register arrays that include the target values and active/inactive status flags of the timers are used to implement specific timers. Comparators are used to compare values of the reference counter to the target values to establish expiration of the requested timed triggers. A target translation logic block translates a current value of the reference counter to an offset value from the target values for monitoring by an external circuit.

20 Claims, 7 Drawing Sheets

OPTIMAL TIMER ARRAY

CROSS-REFERENCE RELATED APPLICATIONS

The present application is a continuation of U.S. Non-Provisional patent application Ser. No. 18/452,193 filed on Aug. 18, 2023, which, in turn, is a continuation of U.S. Non-Provisional patent application Ser. No. 17/182,148 filed on Feb. 22, 2021, now U.S. Pat. No. 11,768,515 issued on Sep. 26, 2023, the contents of all of which are incorporated herein by reference in their entirety.

The present teachings relate to timer arrays used to synchronize events in radio frequency (RF) circuits. More particularly, the present teachings relate to methods and apparatuses for an optimal timer array using a single reference counter.

BACKGROUND

FIG. 1A shows a simplified block diagram of a prior art RF frontend system (100) that may be used in an RF communication system. The system (100) comprises a signal aware controller block (110), such as, for example, a modem baseband or a transceiver, in communication over an interface bus (115) with RF blocks (121, 122, 123, . . . , 12*n*). Each RF block may be comprised of multiple die (e.g., multi-die module) as shown for RF blocks (121, 123), or a single die (making an integrated circuit, IC) as shown for RF blocks (122, 12*n*). For example, RF block (121) may include multiple die (S21*a*, S21*b*, S21*c*), RF block (122) may include a single die (S22*a*), RF block (123) may include multiple ICs (S23*a*, S23*b*), and RF block (12*n*) may include a single die (S2*na*). In turn, such ICs (S21*a*, . . . , S2*na*) may include circuits to process transmit and/or receive RF signals through the RF frontend system (100), such as, for example, power amplifiers (PAs), low-noise amplifiers (LNAs), antenna tuners, filters/matching circuits, and (RF) switches With continued reference to FIG. 1A, communication over the interface bus (115) may be according to a master/slave protocol wherein the controller RF block (110) is configured as a master device to control operation of the ICs (e.g., S21*a*, . . . , S2*na*) of the RF blocks (121, 122, . . . , 12*n*) configured as slave devices. Configuration of the controller RF block (100) and the ICs (e.g., S21*a*, . . . , S2*na*) of the RF blocks (121, 122, . . . , 12*n*) for operation according to master or slave devices is provided via local digital circuits designed according to a specific interface protocol over the interface bus (115).

A well-known in the art interface protocol is provided by the MIPI (mobile industry processor interface) RFFE (RF frontend) specification which uses a two-wire serial bus as shown in FIG. 1B. A unidirectional signal line (wire) may be used for transmitting a clock (CLK) from the master device to the slave devices, and a bidirectional signal line may be used for sending and receiving data (DATA) between the master device and the slave devices. It should be noted that although not shown in FIG. 1B, both the master and the slave devices may share a common supply/reference voltage.

In the master/slave configuration (100) shown in FIG. 1A, ICs configured as slaves (e.g., S21*a*, . . . , S2*na*) may use triggers to synchronize events within a same IC or a same RF block, or between different ICs sharing the same interface bus (115). As known to a person skilled in the art, such triggers may be locally implemented (i.e., in each IC) via an array of "timed-trigger" timers, also referred to as an array of timers (or counters) or a timer array. Such timers may be programmed/requested to count a certain number of clock cycles before expiration. Counting may be performed by counters implemented via well known in the art digital circuits (e.g. flip-flops). Upon expiration of a requested timer, a flag may be set and used to trigger an event corresponding to the requested timer.

FIG. 2A shows a block diagram of a prior art digital circuit (200) comprising a timer array (215) used to implement (timed-) trigger events. Such digital circuit (200) may be implemented in any of the ICs (e.g., S21*a*, . . . , S2*na*) of FIG. 1A configured as slave devices. As shown in FIG. 2A, the prior art digital circuit (200) comprises a circuit block (210) that is configured to program (e.g., via RQ signal line/lines) timers of the timer array (215), as well as monitoring (e.g., via MON signal line/lines) status of the timers. Each timer of the timer array (215) may include a counter (e.g., Counter1, . . . , CounterN), a control logic (Ctrl1, Ctrl2, . . . , CtrlN) that controls operation of the associated counter according to well-known in the art design techniques, and a (digital) comparator (e.g., Comp1, . . . , CompN) that compares values of an associated counter to a reference programmed/requested value to determine expiration of the timer, and thereby output a trigger (flag) to an event driven circuit (220). It should be noted that programming of the timers via the circuit block (210) may include requesting a time count based on a number of clock cycles from the timer array (215). It should be noted that the event driven circuit (220) may be part of the same IC (e.g., S21*a*, . . . , S2*na* of FIG. 1A) as the circuits (210, 215), or part of a different IC within a same multi-die RF block (e.g., 121, 123 of FIG. 1A) that contains the circuits (210, 215).

Operation of the timer array (215) may be exemplified by the timing diagram of FIG. 2B, which shows two timers in operation. A first timer is represented by a corresponding counter, Counter1, and a second timer by a corresponding counter, Counter2. Both counters running from a same (master) clock, such as one provided, for example, by an interface protocol (e.g., FIG. 1B). At rest, when no timer is activated, both counters, Counter1 and Counter2, may be initialized to zero and counting may be inhibited. At time, T1, Counter2 of the second timer is initialized to a value (e.g., 14) that represents (a requested) timing based on a number (e.g., 14) of clock cycles to a first triggering event/action. Accordingly, Counter2 of the second timer counts 14 cycles of the clock and stops counting at time T3 which coincides with the expiration of the second timer. Similarly, at time, T2, and while the second timer is activated, Counter1 of the first timer is initialized to a value (e.g., 7) that represents (a requested) timing based on a number (e.g., 7) of clock cycles to a second triggering event/action. Accordingly, as can be seen in FIG. 2B, Counter1 and Counter2 are simultaneously counting between times T2 and T3. Counter1 of the first timer counts 7 cycles of the clock and stops counting at time T4 which coincides with the expiration of the first timer. Each of the first and the second timers may compare the count values of the respective counters, Counter1 and Counter2, to a reference value to determine expiration of the timers, and therefore generation of a trigger (flag). For example, in the case of down-counting counters shown in FIG. 2B, the comparators, Comp1 and Comp2, may compare the count values to a fixed reference value of zero. On the other hand, for a case of up-counting, the counters, Count1 and Count2, may start counting up from zero, and the comparators, Comp1 and Comp2, may compare the count values to respective target count values (e.g., 14 and 7). It should be noted that such target count values may be the requested count values that are directly provided to the timer array (215) by the circuit block (210).

With reference back to FIG. 2A, monitoring of status of the timers of the timer array (215) can be provided via the MON signal lines to activate readout of counter values (e.g., of counters Counter1, . . . , CounterN) through, for example, a known in the art logic latch (275). Such counter values can be directly used by the circuit block (210) to establish status and/or progress of each of the timers of the timer array (215). A person skilled in the art would know of many digital design techniques for reading such counter values, all outside the scope of the present disclosure.

With further reference to FIG. 2A, it is noted that in prior art applications, the timer array (215) may include a high number, N, of timers (e.g., CounterN, CtrlN, CompN), where N can be an integer larger than 10. For example, a current version of the MIPI RFFE specification (e.g., version 3.0) allows for up to 15 timers for each slave IC (e.g., S21*a*, . . . , S2*na* of FIG. 1A). In a case of a multi-die RF block, such number may be multiplied by a number of ICs included in the RF block. For example, considering the RF block (121) of FIG. 1A, such RF block may include a total of 45 timers, 15 for each of the three modules (S21*a*, S21*b*, S21*c*) when considering the current version of the MIPI RFFE specification. Furthermore, considering the same specification for the prior art frontend system (100) of FIG. 1A, up to 15 slave RF blocks similar to RF block (121) may be communicating over the same interface bus (115), and therefore such system (100) may include a total of 15×45=675 timers.

It should be noted that although unlikely, all such timers may operate (i.e., counting) simultaneously, including synchronous switching events (e.g., flip-flops) due to use of a same (master) clock across all counters (e.g., Counter1, . . . , CounterN of FIG. 2A), and therefore subject a system, such as the prior art frontend system (100), to substantial power consumption and potential digital noise issues. As the number of timers increases in an RF block (e.g., any one of 121, 122, 123, . . . , 12*n*), digital noise generated by (synchronous) incrementing and/or decrementing counters of the timers also increases. Accordingly, designers may recourse to common layout solutions to address such increase in digital noise with added components (e.g., decoupling capacitors, guard rings, added shielding, etc.) at the expense of a less compact layout. As the number of timers increases across the entire system (e.g., 100 of FIG. 1A), dynamic power (e.g., peak power) consumed by the system also increases. As the number of timers increases, number of digital paths with substantial number of logic gates between respective endpoints increases, thereby potentially affecting timing precision within such digital paths and timing consistency across such digital paths. Furthermore, with reference to FIG. 2A, physical die area consumed due to redundancy of counters (e.g., Counter1, . . . , CounterN of FIG. 2A) used for implementing the timer array (215) may take up a substantial portion of the physical die area of the digital circuit (200), in some cases up to 30% of the total digital area consumed.

Teachings according to the present disclosure describe methods and devices for a timer array that uses a single reference counter, thereby overcoming the above issues associated with the prior art timer arrays, including issues with regard to size, power consumption, digital noise, timing and layout. Accordingly, relative to the prior art timer array, the timer array according to the present disclosure may be considered as an optimal timer array.

SUMMARY

According to a first aspect of the present disclosure, a radio frequency (RF) device is presented, the RF device comprising: an RF circuit configured to process an RF signal; and a digital circuit configured to communicate with a master device separate from the RF device, the digital circuit comprising: a timer array configured to generate a plurality of timed triggers for synchronization of events between the master device and the RF circuit, the timer array comprising: a reference counter operating from a reference clock; and a count translation logic block that is configured to translate a number of reference clock counts corresponding to each timed trigger of the plurality of timed triggers to a target offset value of the reference counter.

According to second aspect of the present disclosure, a digital circuit is presented, the digital circuit comprising: a timer array configured to generate a plurality of timed triggers, the timer array comprising: a reference counter operating from a reference clock; and a count translation logic block that is configured to translate a number of reference clock counts corresponding to each timed trigger of the plurality of timed triggers to a target offset value of the reference counter.

According to third aspect of the present disclosure, a method for generating a timed trigger event is presented, the method comprising: providing a reference counter operating from a reference clock; establishing a plurality of timers by assigning to each timer a target offset register, a set valid flag register, and a comparator; translating a requested timed trigger event into a target offset value of the reference counter and storing the target offset value to the target offset register of a respective timer of the plurality timers; setting a valid flag indicative of the requested timed trigger event and storing a value of the valid flag to the set valid flag register of the respective timer; based on the translating and the setting, comparing via a comparator of the respective timer a current value of the reference counter to the target offset value; and based on the comparing, generating the requested timed trigger event when the current value is equal to the target offset value.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

DETAILED DESCRIPTION

Throughout this description, embodiments and variations are described for the purpose of illustrating uses and implementations of the inventive concept. The illustrative description should be understood as presenting examples of the inventive concept, rather than as limiting the scope of the concept as disclosed herein.

The present disclosure describes electrical circuits in electronic devices (e.g., cell phones, radios, base stations, etc.) having a plurality of devices, such as for example, transistors (e.g., MOSFETs). Persons skilled in the art will appreciate that such electrical circuits comprising transistors can be arranged as power amplifiers (PAs), low-noise amplifiers (LNAs), antenna tuners, filters, and switches, and may be used, for example, in RF communication systems as slave devices that communicate over a common interface bus with a master device. Communication over the common interface bus provided via dedicated digital circuits embedded in the slave and master devices.

The (optimal) timer array (e.g., 315 of FIG. 3A) according to the present teachings overcomes the above described prior art shortcoming by reducing the total number of counters to a single reference counter (e.g., 310 of FIG. 3A) that is free-running or running while at least one trigger/timer is pending (e.g., processing a requested timed trigger event). Such reference counter is therefore providing a reference count that is used by all timers of the timer array. Accordingly, all timers of the timer array according to the present teachings operate based on values of the reference counter relative to original values of the reference counter at the time of initialization/activation of the timers (i.e., time of request). In other words, for a given timer of the timer array, a desired number of (clock) counts corresponding to a requested timed trigger is provided by a target value of the reference counter that is offset by the desired number of counts from an original value of the reference counter obtained at initialization/activation of the timer.

Figure 3A:
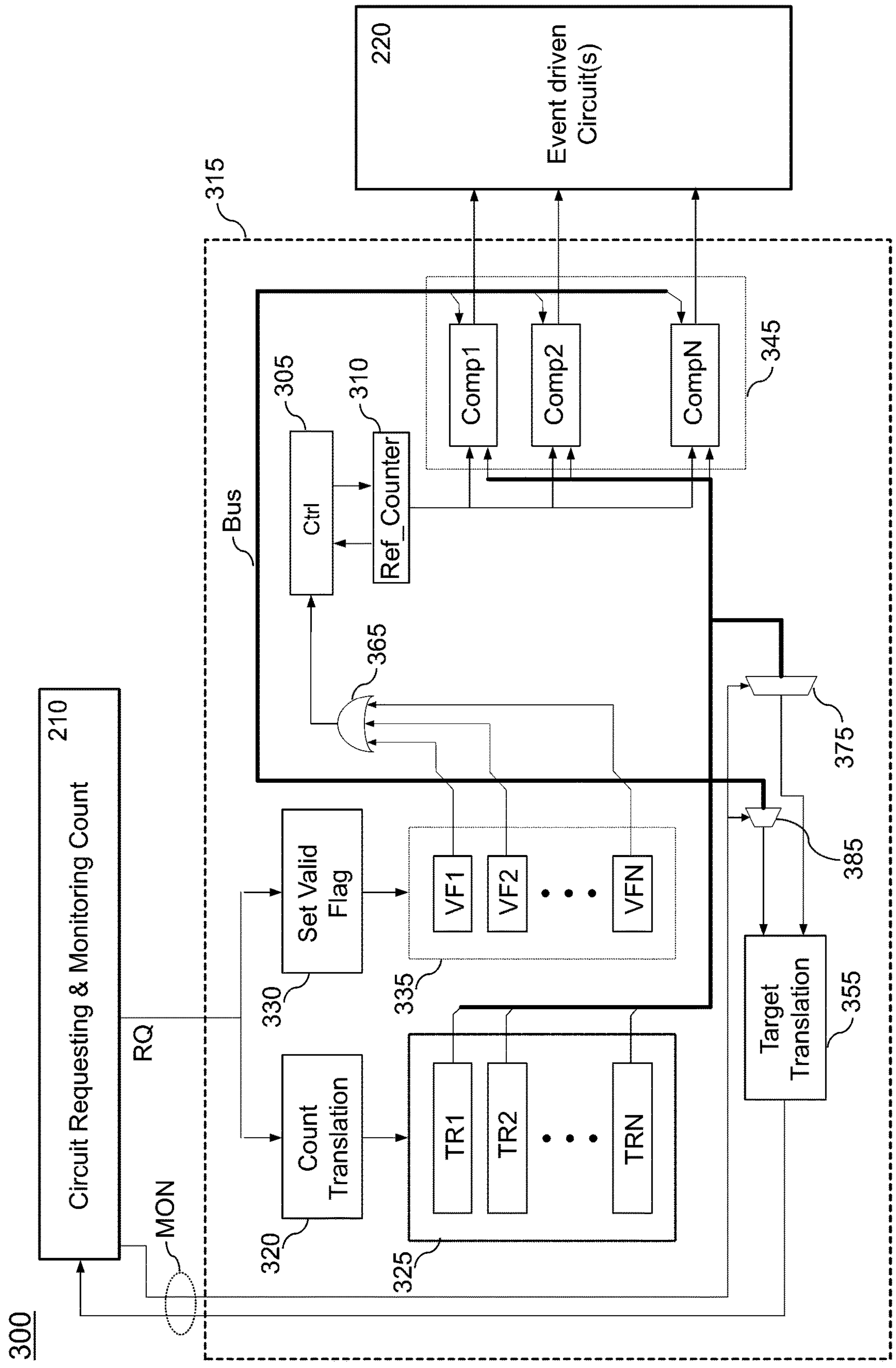
FIG. 3A shows a block diagram of a digital circuit comprising a timer array according to the present disclosure.

In order to account for varying values of the reference counter at initialization of a timer, each timer of the timer array (e.g., 315 of FIG. 3A) according to the present teachings may include, or be associated with, a target register (e.g., TR1, . . . , TRN of 325 of FIG. 3A) that stores the target value of the reference counter (e.g., 310 of FIG. 3A). Such target value may be generated via a count translation logic block (e.g., 320 of FIG. 3A) with access to the counter value of the reference counter (e.g., 310 of FIG. 3A).

Active or inactive status of each of the timers of the timer array (e.g., 315 of FIG. 3A) according to the present teachings may be provided via respective valid (status) flag registers (e.g., VF1, . . . , VFN of 335 of FIG. 3A) that may be set during an active state of a timer, and reset upon expiration of the timer. Setting and resetting of such registers may be provided via a set valid flag logic (e.g., 330 of FIG. 3A) based on a valid requested timer count value. For example, a high state of the valid flag may indicate processing by an associated timer of a timed trigger event, and a low state of the valid flag may indicate expiration of the timer.

The reference counter (e.g., 310 of FIG. 3A) may be controlled to start counting upon detection of at least one (valid) timer request. Control may be provided by a reference counter controller (e.g., 305 of FIG. 3A) with access to the valid flag registers (e.g., VF1, . . . , VFN of 335 of FIG. 3A). The reference counter controller may control the reference counter to maintain counting till all timers have expired. Once all timers have expired, the reference controller may (optionally) be controlled to stop counting, and optionally controlled to reset its count (state). According to some exemplary embodiments of the present disclosure, the reference counter may be free-running, and therefore continuously count (up or down) irrespective of any active or inactive timers.

A trigger event associated to a timer of the timer array (e.g., 315 of FIG. 3A) according to the present teachings may be provided by a comparator in a manner similar to the prior art configuration described above with reference to FIG. 2A. A comparator (e.g., Comp1, . . . , CompN of FIG. 3A) may compare a current value of the reference counter (e.g., 310 of FIG. 3A) to the target value stored in an associated target register (e.g., TR1, . . . , TRN of FIG. 3A). If the two values match then a trigger may be asserted and output to an event driven circuit (e.g., 220 of FIG. 3A). With reference to FIG. 3A, it should be noted that the event driven circuit (220) may include digital circuits and/or RF circuits whose functions, or sequence of functions, may be based on trigger events (e.g., timed triggers) generated by the timer array (315). In turn, such trigger events may be based on commands received by a slave device (e.g., 121, 123, . . . , 12*n* of FIG. 1A) from, for example, a master device (e.g., (110 of FIG. 1A) for synchronization of events/functions between different devices (e.g., 110, 121, 122, 12*n* of FIG. 1A) on an interface bus (e.g., 115 of FIG. 1A). For example, elements (S21*a*, S21*b*, S21*c*) may include respective low noise amplifiers (LNAs) and/or power amplifiers (PAs) each controllable according to, for example, a startup and a shutdown sequence based on respective sequence of trigger events. Triggered functions may include, for example, ON/OFF state, bias level, gain band and transmit or receive modes of operation.

Figure 1A:
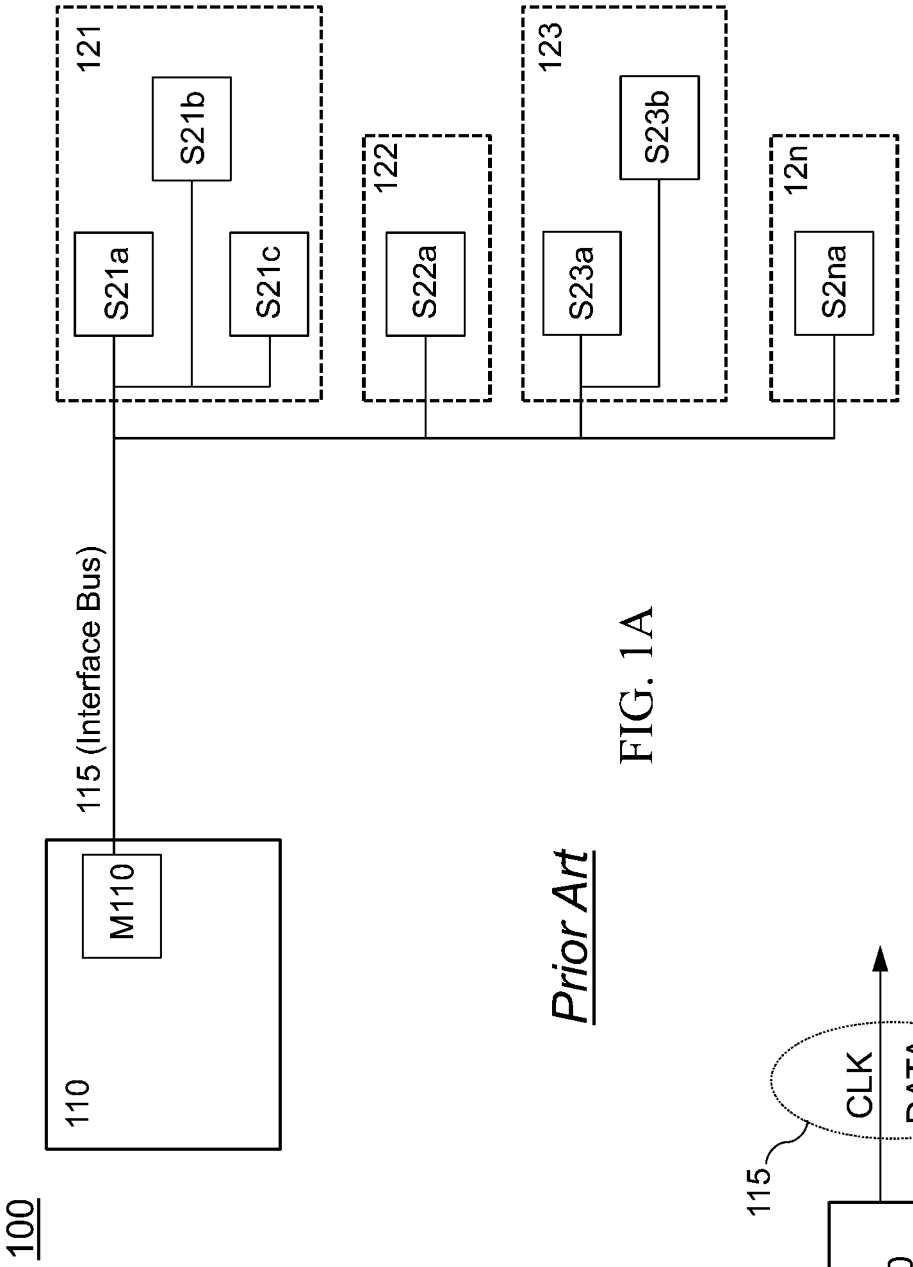
Prior Art FIG. 1A
FIG. 1A shows a simplified block diagram of a prior art RF frontend system.
Figure 1B:
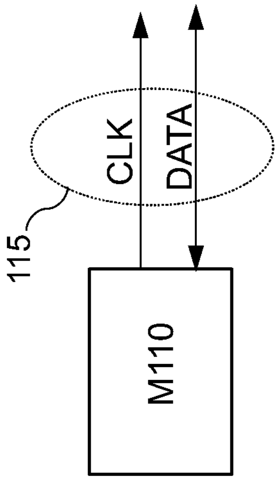
FIG. 1B shows an interface protocol comprising a two-wire serial bus.

The timer array (e.g., 315 of FIG. 3A) according to the present teachings may allow seamless integration into a digital circuit of an existing slave device (e.g., S21*a*, . . . , S2*an* of FIG. 1A). In other words, the present timer array may be backward compatible with the prior art timer array (e.g., 215 of FIG. 2A). Backward compatibility for a timer request (e.g., via RQ of 210 of FIG. 2A or 3A) may be provided via a count translation logic block (e.g., 320 of FIG. 3A) that translates a desired/requested number of block counts to a target value of the reference counter (e.g., 310 of FIG. 3A) based on the original value of the reference counter at the time of the request (e.g., initialization/activation). Likewise, backward compatibility for a timer (status) monitoring (e.g., via MON of 210 of FIG. 2A or 3A) may be provided via (target) translation logic block (e.g., 355 of FIG. 3A) that may translate a current value of the reference counter to an offset value from the target value stored in a target register (e.g., TR1, . . . , TRN of 325 of FIG. 3A), or in other words, to an absolute remaining time count on the timer.

The reference counter (e.g., 310 of FIG. 3A) according to the present teachings may be an up-counter or a down-counter. According to some embodiments of the present disclosure, the reference counter may count according to any cyclic code pattern, such as provided by, for example, a gray code, a ring counter, a ripple counter or any sequence of unique and repetitive/cyclic codes. The count and target translation logic blocks (e.g., 320 and 355 of FIG. 3A) according to the present disclosure may be designed according to the cyclic code of the reference counter. Accordingly, it should be noted that a sequence of codes output by the reference counter according to the present teachings may not necessarily be represented by increasing or decreasing numbers. In other words, in some embodiments of the present disclosure the reference counter may be described as a finite-state machine with output states that describe the sequence code.

It should be noted that the count and target translation logic blocks (e.g., 320 and 355 of FIG. 3A) and the reference counter controller (e.g., 305 of FIG. 3A) are independent of the number of timers supported by the design of the timer array (e.g. 315 of FIG. 3A) according to the present teachings. Furthermore, the reference counter (e.g., 310 of FIG. 3A) grows only if the counter width (e.g., number of bits) increases. Therefore, as the number of timers grows, a physical die area consumed by the timer array according to the present teachings increases marginally (relatively small amount), and substantially less compared to the prior art timer array (e.g., 215 of FIG. 2A). Accordingly, relative to the prior art timer array, the timer array according to the present disclosure may be considered as an optimal timer array. It should be noted that the block diagram shown in FIG. 3A represents elements of the timer array according to the present disclosure with details sufficient for describing function and structure of the timer array.

Figure 2A:
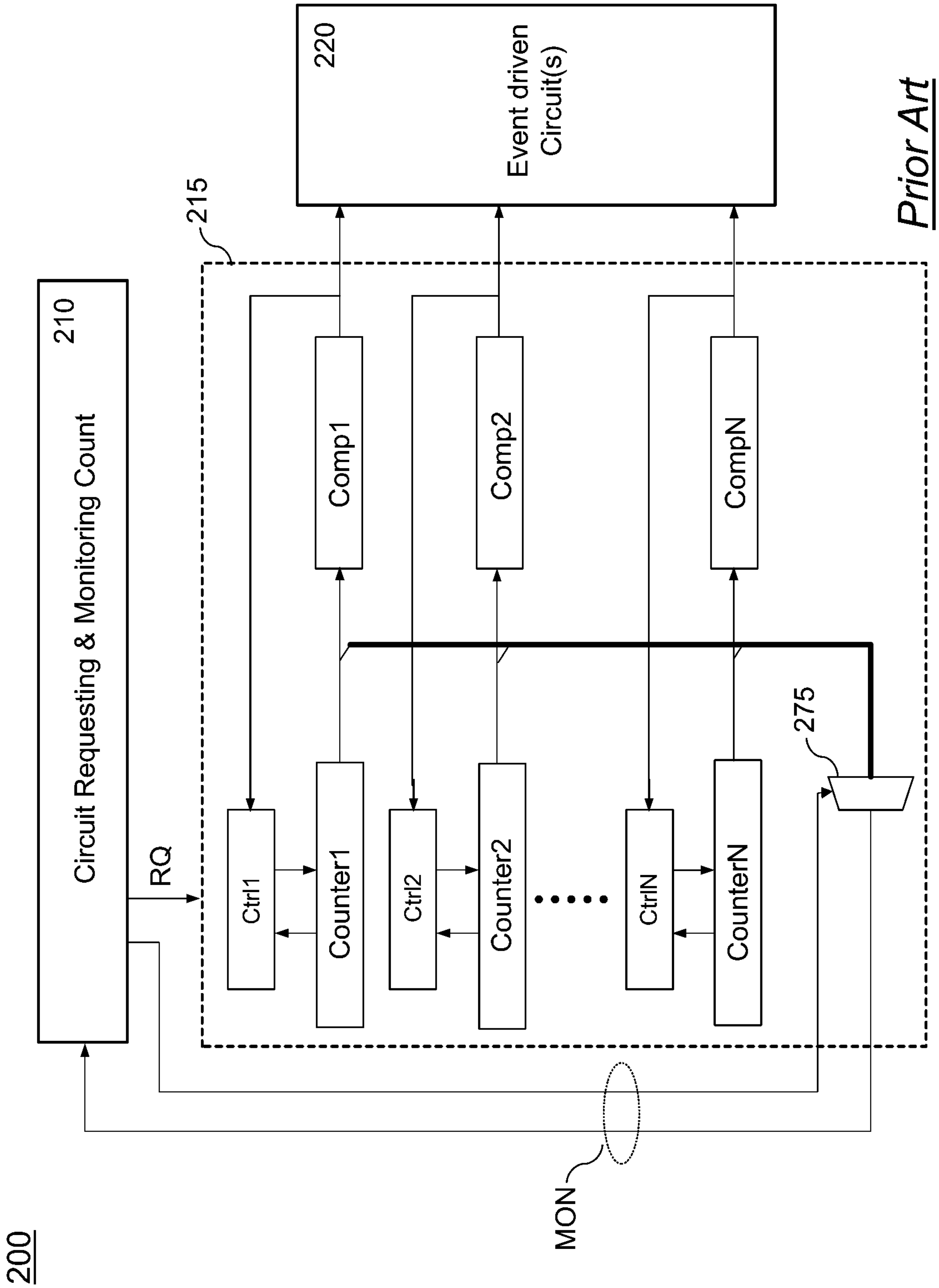
Prior Art FIG. 2A
FIG. 2A shows a block diagram of a prior art digital circuit comprising a timer array.
Figure 2B:
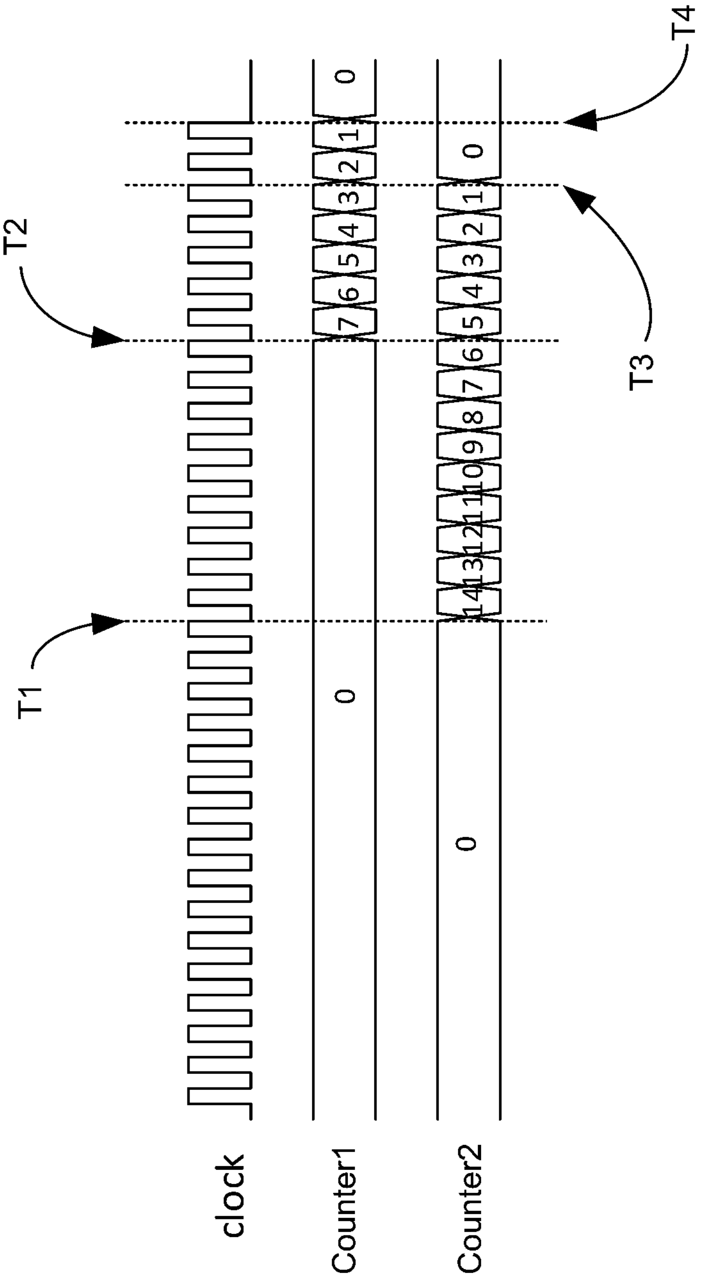
FIG. 2B shows a timing diagram representative of operation of two timers of the prior art timer array of FIG. 2A.

By reducing the (high) number of counters used in the prior art timer array (e.g., Counter1, . . . , CounterN of 215 of FIG. 2A) to the single reference counter (e.g., 310 of FIG. 3A) and replacing such counters by registers (e.g., TR1, . . . , TRN of 325 and VF1, . . . , VFN of 335 of FIG. 3A) that do not necessarily need to operate at the higher counter clock frequencies, timing constraints of the timer array (e.g., 315 of FIG. 3A) according to the present teachings may be relaxed (e.g., use lower/divided clock frequency) which in turn may lead to a smaller clock tree and easier timing closure when compared to the prior art timer array (e.g., 215 of FIG. 2A). Accordingly, relative to the prior art timer array, the timer array according to the present disclosure may be considered as an optimal timer array.

Such reduction in the number of counters and possible lower clock frequencies of the registers used in the timer array (e.g., 315 of FIG. 3A) according to the present teachings, provide for a reduction in number of (simultaneous) transitions/switching events which leads to a reduction in consumed (peak) power as well as in generated digital noise. In turn, since less digital noise is generated, recourse to common layout solutions with added component to counter higher digital noise may not be needed, and therefore a more compact layout may be provided when compared to the prior art timer array (e.g., 215 of FIG. 2A). Accordingly, relative to the prior art timer array, the timer array according to the present disclosure may be considered as an optimal timer array.

FIG. 3A shows a block diagram of a digital circuit (300) comprising the timer array (315) according to the present disclosure. The digital circuit (300) includes blocks (210, 315, 220) which may be likened in functionality to blocks (210, 215, 220) described above with reference to FIG. 2A. Blocks/elements referred to in FIGS. 2A and 3A by same reference designators are assumed to be same in functionality and implementation (design). This includes, for example, blocks (210) and (220). Accordingly, only implementation of the block (315), the timer array according to the present teachings, is further described below.

With continued reference to FIG. 3A, functionality of each of N timers of the timer array (315) may be provided by timer specific blocks that only support respective timers, and shared/common blocks that support all the timers. Timer specific blocks may include the registers (TR1, . . . , TRN) of the target register array (325), the registers (VF1, . . . , VFN) of the valid flag array (335), and the comparators (Comp1, . . . , CompN) of the comparator array (345). On the other hand, the shared/common blocks may include the reference counter (310), the reference counter controller (305), the count translation logic block (320), the set valid flag block (330) and the target translation logic block (355). Other miscellaneous glue logic, such as blocks (365, 375, 385) may be shared by all N timers of the timer array (315). As shown in FIG. 3A, various constituent blocks of the timer array (315) may communicate over a common bus (Bus) that is internal to the timer array (315). Accordingly, such blocks may access/exchange common data, such as, for example, register values and reference counter values.

Figure 4:
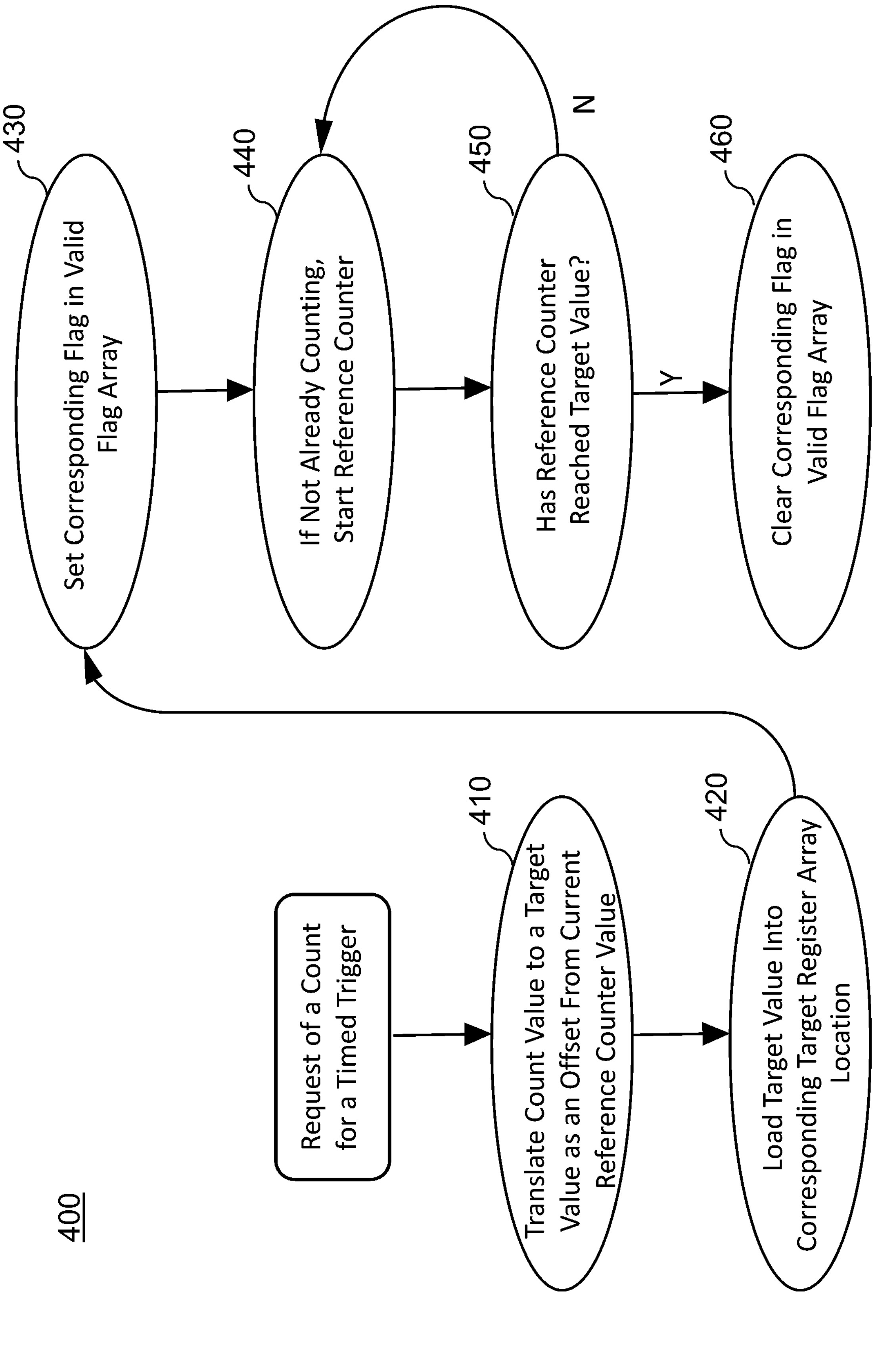
FIG. 4 shows a flowchart representative of process steps for requesting a timed trigger event from the timer array of FIG. 3A.

When a timed trigger is requested (e.g., RQ signal line/lines) by the circuit (210) of FIG. 3A, operation of the timer array (315) may be described with reference to the flowchart of FIG. 4. Accordingly, at step (410), the count translation logic block (320) translates a desired number of (clock) counts corresponding to the requested timed trigger to a target value of the reference counter (310) that is offset by the desired number of counts from an original/current value of the reference counter (310). As shown in step (420), once the translation to a target value of the reference counter (310) is performed, the target value is loaded in a corresponding target register (e.g., TR1, . . . , TRN) of the target register array (325). As shown in step (430), once the target register is loaded, a valid (status) flag associated to the timer is set by the set valid flag logic block (330) and loaded in a corresponding register (e.g., VF1, . . . , VFN) of the valid flag register array (335). It should be noted that steps (410), (420) and (430) may be performed within a same clock period so to reduce any delays in timing with respect to a time of the requested timed trigger. Once the valid flag register array is initialized per step (430), the reference counter (310) is started if not already counting, per step (440). Information about the updated status of the valid flag register array (335) may be provided, via logic block (365), to the reference counter controller (305) which may perform the step (440). Per step (450), a corresponding comparator (e.g., Comp1, . . . , CompN) of the comparator array (345) continuously compares value of the reference counter (310) to the target value, and per step (460), once the target value is reached, the valid flag associated to the timer is reset. In turn, the resetting of the valid flag may activate the timed trigger event via a trigger signal provided to the event driven circuit (220).

Figure 3B:
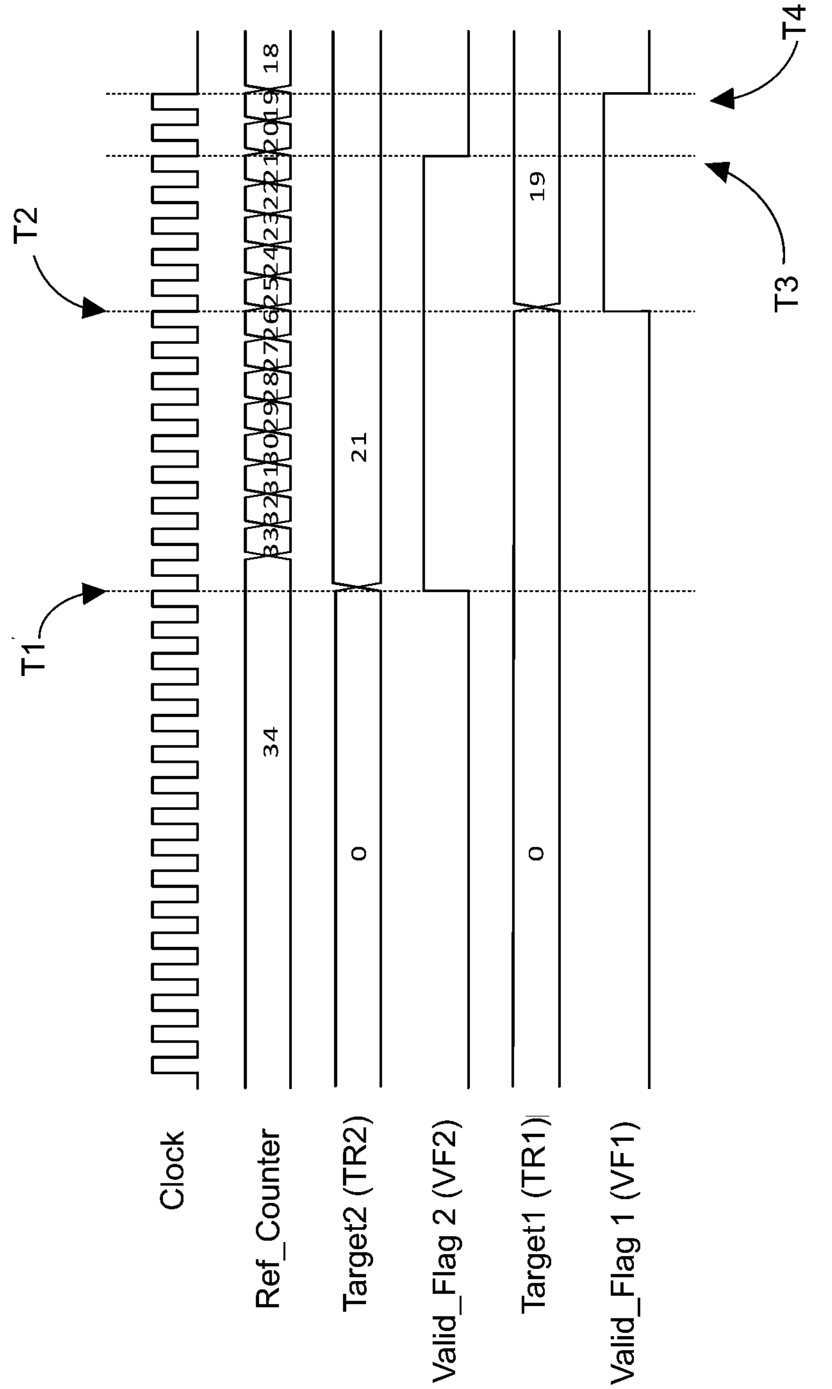
FIG. 3B shows a timing diagram representative of operation of the timer array of FIG. 3A.

Operation of the timer array (315) according to the present disclosure may be exemplified by the timing diagram of FIG. 3B, which shows two timers in operation, respectively represented by their target registers (e.g., TR1, TR2) and valid flags (e.g., VF1, VF2). The reference counter, (310, labelled as Ref_Counter in FIG. 3B) may be considered as a shared resource and therefore participates in the operation of both timers. In the exemplary case shown in FIG. 3B, the reference counter, Ref_Counter, is assumed to be a down-counter. At rest, when no timer is activated, both target registers (TR1, TR2) may contain a zero value and both valid flags (VF1, VF2) may be set to inactive/invalid (e.g., low logic level). Furthermore, assuming that no other timers are active, the reference counter, Ref_Counter, may be inhibited and therefore not count. In the exemplary case shown in FIG. 3B, the reference counter is shown at a nonlimiting value of 34. At time, T1, the target register TR2 of the second timer is initialized/loaded to a value (e.g., 21) that represents timing based on a (requested) number (e.g., 14) of clock cycles to a first triggering event/action. As described above, the value of TR2 is based on an offset from the current value (e.g., 34 at T1) of the reference counter, Ref_Counter. At the same time, the valid flag, VF2, for the second timer is set and the reference counter, Ref_Counter, is started. Accordingly, after 14 counts of the reference counter, at time T3, the reference counter reaches the target register value TR2, and the valid flag, VF2, is reset, thereby expiring the second timer. Similarly, at time, T2, and while the second timer is activated, the target register TR1 of the first timer is initialized/loaded to a value (e.g. 19) that represents timing based on a (requested) number (e.g., 7) of clock cycles to a second triggering event/action. As noted above, the value of TR1 is based on an offset value from the current value (e.g., 26 at T2) of the reference counter, Ref_Counter. At the same time, the valid flag, VF1, for the first timer is set while the reference counter, Ref_Counter, is counting (was previously started). Accordingly, after 7 counts of the reference counter, at time T4, the reference counter reaches the target register value TR1, and the valid flag, VF1, is reset, thereby expiring the first timer.

Figure 5:
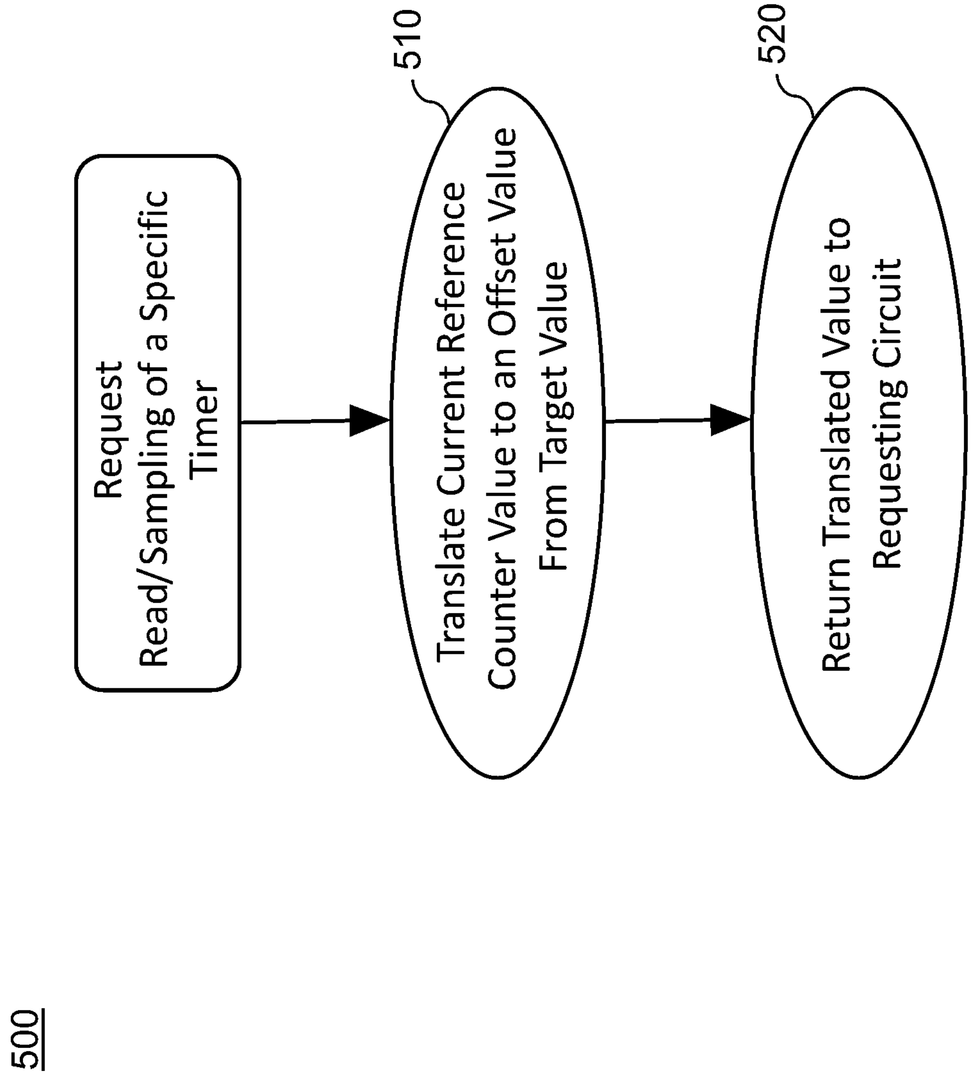
FIG. 5 shows a flowchart representative of process steps for reading a status of the timer array of FIG. 3A.

When monitoring (i.e., read, sampling) of status of a timer is requested (e.g., MON signal line/lines) by the circuit (210) of FIG. 3A, operation of the timer array (315) may be described with reference to the flowchart of FIG. 5. Accordingly, at step (510), the target translation logic block (e.g., 355 of FIG. 3A) translates a current value of the reference counter (310) to an offset value from the target value stored in a target register (e.g., TR1, . . . , TRN of 325 of FIG. 3A) associated with the requested timer, or in other words, to an absolute remaining time count on the timer. This can be performed via logic blocks (e.g., registers/latches 375, 385) that read the current value of the reference counter (310) and of the target register (e.g., TR1, . . . , TRN) of the requested timer, and feed to the target translation logic block (355) to perform the translation. Per step (520), once the translation is performed, the target translation logic block (355) may output the translated value to the circuit (210) that requested the monitoring of the status of the timer. Selection/identification of the specific timer whose status is requested by the circuit (210) may be based on information provided to the timer array (315) via the MON signal line(s).

It should be noted that the various embodiments of the (optimal) timer array according to the present disclosure, may be implemented as a monolithically integrated circuit (IC) according to any fabrication technology and process known to a person skilled in the art.

Applications that may include the novel apparatus and systems of various embodiments include electronic circuitry used in high-speed computers, communication and signal processing circuitry, modems, single or multi-processor modules, single or multiple embedded processors, data switches, and application-specific modules, including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., mp3 players), vehicles, medical devices (e.g., heart monitor, blood pressure monitor, etc.) and others. Some embodiments may include a number of methods.

As should be readily apparent to one of ordinary skill in the art, various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design A number of embodiments according to the present disclosure have been described. It is to be understood that various modifications may be made without departing from the spirit and scope of such embodiments. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the disclosure, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. A digital circuit, comprising:

a timer array configured to generate a plurality of timed triggers, the timer array comprising:

a reference counter operating from a reference clock;

a count translation logic block that is configured to translate a number of reference clock counts corresponding to each timed trigger of the plurality of timed triggers to a respective target offset value of the reference counter; and a target translation logic block that is configured to translate, for each timed trigger of the plurality of timed triggers, a current value of the reference counter to an offset value based on a number of reference clock counts to the respective target offset value of the reference counter.

2. The digital circuit of claim 1, wherein the respective target offset value of the reference counter is at an offset equal to the number of reference clock counts from a value of the reference counter at the time of request of the each timed trigger.

3. The digital circuit of claim 1, wherein:

the reference counter is free running, and the time of request of a first timed trigger of the plurality of timed triggers is different from the time of request of a second timed trigger of the plurality of timed triggers.

4. The digital circuit of claim 1, wherein the timer array further comprises:

an array of a plurality of target registers configured to store the respective target offset value corresponding to the each timed trigger of the plurality of timed triggers.

5. The digital circuit of claim 1, wherein the timer array further comprises:

a set valid flag logic block that is configured to:

set a respective valid flag at a time of request of the each timed trigger, and reset the respective valid flag at a time of completion of the each timed trigger.

6. The digital circuit of claim 5, wherein the timer array further comprises:

an array of a plurality of valid flag registers configured to store a value of the respective valid flag of the each timed trigger of the plurality of timed triggers.

7. The digital circuit of claim 1, wherein the timer array further comprises:

an array of a plurality of comparators configured to compare a current value of the reference counter to the respective target offset value corresponding to the each timed trigger of the plurality of timed triggers.

8. The digital circuit of claim 1, wherein the reference counter comprises:

a) a binary counter; b) a gray code counter; c) a ring counter; d) a ripple counter; or e) a cyclic code counter.

9. The digital circuit of claim 1, further comprising:

a slave interface circuit configured to communicate with a master device over an interface bus.

10. The digital circuit of claim 9, wherein:

the interface bus is according to the MIPI RFFE interface.

11. A radio frequency (RF) device, comprising:

an RF circuit configured to process an RF signal; and a digital circuit configured to communicate with a master device separate from the RF device, the digital circuit being a digital circuit according to claim 9.

12. The RF device of claim 11, wherein the RF circuit comprises one or more of: a) a power amplifier; b) a low-noise amplifier; c) a filter; d) a matching circuit; e) an RF switch; or f) an antenna tuner circuit.

13. A radio frequency (RF) module, comprising an RF device according to claim 11.

14. A radio frequency (RF) multi-die module, comprising:

a plurality of dies, wherein each die of the plurality of dies comprises an RF device according to claim 11.

15. A radio frequency (RF) frontend system, comprising one or more RF devices according to claim 11.

16. A radio frequency (RF) device, comprising:

an RF circuit configured to process an RF signal; and a digital circuit configured to communicate with a master device separate from the RF device, the digital circuit comprising:

a timer array configured to generate a plurality of timed triggers for synchronization of events between the master device and the RF circuit, the timer array comprising:

a reference counter operating from a reference clock;

a count translation logic block that is configured to translate a number of reference clock counts corresponding to each timed trigger of the plurality of timed triggers to a target offset value of the reference counter; and a target translation logic block that is configured to translate, for each time trigger of the plurality of timed triggers, a current value of the reference counter to an offset value based on a number of reference clock counts to the target offset value of the reference counter.

17. A method for generating a plurality of timed trigger events, the method comprising:

providing a reference counter operating from a reference clock;

translating a requested timed trigger event of the plurality of timed trigger events into a target offset value of the reference counter;

translating a current value of the reference counter to an offset value based on a number of reference clock counts to the target offset value of the reference counter; and generating the requested timed trigger event when the offset value is equal to the target offset value.

18. The method according to claim 17, further comprising:

establishing a plurality of timers by assigning to each timer a target offset register; and storing the target offset value of the requested timed trigger event to the target offset register of a respective timer of the plurality timers.

19. The method according to claim 17, further comprising:

establishing a plurality of timers by assigning to each timer a set valid flag register; and setting a valid flag indicative of the requested timed trigger event and storing a value of the valid flag to the set valid flag register of the respective timer of the plurality of timers.

20. The method according to claim 18, further comprising:

resetting the valid flag at a time of completion of the requested timed trigger event.

* * * * *